United States Patent [19]

Swift, Sr.

[11] 4,437,054

[45] Mar. 13, 1984

[54] ADAPTOR TO FACILITATE TESTING OF A LAMP HOLDER

[75] Inventor: John E. Swift, Sr., Baltimore, Md.

[73] Assignee: Bethlehem Steel Corporation, Bethlehem, Pa.

[21] Appl. No.: 340,398

[22] Filed: Jan. 18, 1982

[51] Int. Cl.³ .......................................... G01R 31/02
[52] U.S. Cl. .............................................. 324/51
[58] Field of Search ...................... 324/51, 53

[56] References Cited

U.S. PATENT DOCUMENTS

| | | | |
|---|---|---|---|
| 2,705,773 | 4/1955 | Ward | 324/51 X |
| 2,901,724 | 8/1959 | Lahr | 339/154 |
| 3,040,286 | 6/1962 | Heller et al. | 339/64 |
| 3,871,732 | 3/1975 | Appleton | 339/91 L |

4,180,302  12/1979  Gordon .............................. 324/51 X

*Primary Examiner*—Stanley T. Krawczewicz
*Attorney, Agent, or Firm*—John I. Iverson; William B. Noll; John J. Selko

[57] ABSTRACT

An adaptor to facilitate the testing of a lamp holder has a body portion with a probe at one end for straight line movement into and out of a lamp holder socket. The probe has an electrically conductive tip for contacting the hot lead of the socket. The probe also has a band of electrically conductive material for contacting the neutral lead of the socket. A spring clip attached to the body is positioned to contact the ground lead of the lamp holder. The adaptor also includes a three-hole receptacle electrically connected to the tip, band and spring clip.

3 Claims, 2 Drawing Figures

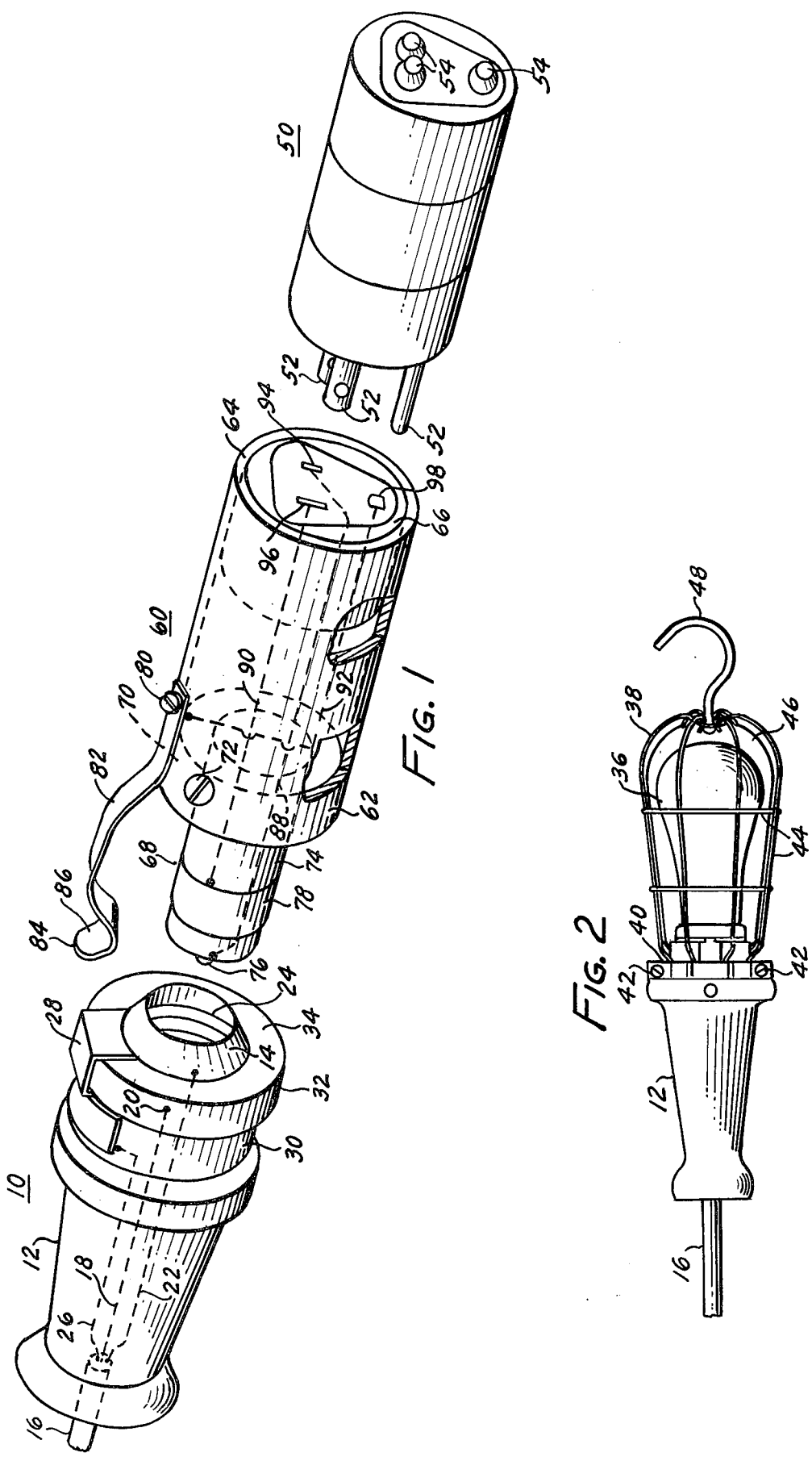

ADAPTOR TO FACILITATE TESTING OF A LAMP HOLDER

BACKGROUND OF THE INVENTION

Present day safety regulations require industry to periodically test portable lamp holders. The testing is done to verify the wiring polarity and ground continuity in the lamp holders. In some cases there are large numbers of lamp holders which must be tested to satisfy such regulations. Since the sockets of most lamp holders are of the screw type, i.e. the lamp holder accepts a lamp having a screw type base, in the past screw-in adaptors were used to facilitate such testing. Use of screw-in adaptors requires an inordinate amount of time to test lamp holders, especially when a large number of lamp holders must be tested. As a result, the testing of lamp holders is laborious and costly.

SUMMARY OF THE INVENTION

This invention relates generally to electrical testing apparatus and more particularly to an adaptor to facilitate testing of a lamp holder to verify the lamp holder wiring polarity and ground continuity.

An object of this invention is to provide an adaptor which reduces the time and labor required to test the wiring polarity of a lamp holder.

The adaptor of this invention comprises a body made of non-conductive material having an integral probe at one end and a three-hole receptacle at the other end. The tip of the probe is made of electrically conductive material which is electrically connected to one hole of the three-hole receptacle. The tip is designed to be moved into and out of contact with the hot lead of the socket of a lamp holder by straight line motion. A band of electrically conductive material on the probe is positioned to contact the neutral lead of the socket of the lamp holder. The band is electrically connected to a second hole of the receptacle. A spring clip attached to the body is positioned to contact the ground lead of the lamp holder and is electrically connected to the third hole of the receptacle.

BRIEF DESCRIPTION OF THE DRAWINGS

FIG. 1 is a perspective view of this invention.
FIG. 2 is an elevational view of a lamp holder.

DETAILED DESCRIPTION OF THE INVENTION

Referring to FIG. 1, 10 indicates a lamp holder having a handle 12 into which is fitted a screw-in type socket 14 to receive a lamp having a screw-type base. The socket 14 is of a type well known in the art. A three-wire cord 16 passes through handle 12 with the hot wire 18 of the three-wire cord 16 electrically connected to a contact 20 located in the base of the socket 14. The neutral wire 22 of the three-wire cord 16 is electrically connected to the thread portion 24 of the socket 14. The ground wire 26 of the three-wire cord 16 is electrically connected to the ground plate 28. Ground plate 28 is positioned in groove 30 of handle 12 and extends from groove 30 over outer surface 32 of handle 12 and then inwardly over shoulder 34 of handle 12.

As shown in FIG. 2, a lamp 36 having a screw-type base is threaded in the socket 14 of lamp holder 10. A metal guard 38 of a type well known in the art includes a clamp portion 40 which fits in groove 30 over ground plate 28 and is held in place in groove 30 and in contact with ground plate 28 by fasteners 42. Thus the metal guard 38 is electrically connected to ground plate 28. The metal guard 38 may include the usual cage bars 44, reflective shield 46, and hanger hook 48.

Referring to FIG. 1, the numeral 60 indicates generally the adaptor of this invention, the adaptor 60 comprises a body portion 62 in the shape of a tube 64 made of non-conductive material. Positioned within the body portion 62 adjacent one end thereof is a three-hole receptacle 66. The receptacle 66 is secured within the tube 64 by any suitable means, e.g. an adhesive. Extending from the other end of the body portion 62 is a probe 68. Probe 68 has an enlarged diameter cylindrical portion 70 which fits within and is secured to tube 64 by means of a plurality of screws 72 which pass through tube 64 and are in threaded engagement with cylindrical portion 70. Probe 68 also has a reduced diameter cylindrical portion 74 which extends from the end of tube 64 opposite receptacle 66. The reduced diameter cylindrical portion 74 has a diameter size and length such that it fits freely within socket 14 of lamp holder 10. Probe 68 is made of non-conductive material. The tip 76 of probe 68 is made from a conductive material. Positioned about the reduced diameter cylindrical portion 74 of probe 68 is a band 78 of conductive material. Band 78 encircles reduced diameter portion 74 of probe 68 and is spaced from the end of the probe 68 which includes tip 76. Attached to the outside of body portion 62 by fastener 80 is a spring clip 82 which extends longitudinally of the body portion 62 and toward the end of the probe 68. The free end 84 of the spring clip 82 extends from the body portion 62 a distance about equal to the length of the reduced diameter portion 74 of the probe 68. Spring clip 82 includes a concave end portion 86 which is adapted and shaped to slide over and contact ground plate 28 of lamp holder 10.

Referring to FIG. 1, receptacle 66 is of the three-hole type and as shown is a standard National Electrical Manufacturers Association (NEMA) 5-15R receptacle.

As shown diagrammatically in FIG. 1, tip 76 of probe 68 is electrically connected by wire conductor 88 to one hole or hot terminal 94 of receptacle 66. Band 78 which is on probe 68 is electrically connected by wire conductor 90 to a second hole or neutral terminal 96 of receptacle 66. Spring clip 82 is electrically connected by wire conductor 92 to the third hole or ground terminal 98 of receptacle 66.

Referring to FIG. 1, the numeral 50 indicates a standard receptacle circuit tester of a type well known in the art for testing to determine if the proper wiring is present. The circuit tester includes three prongs 52 adapted to be received by the three holes of receptacle 66. The circuit tester 50 includes three lamps 54 with each lamp having a different color. Depending on the combination of lamps 54 which light during testing, one can determine whether a circuit is properly wired and if not properly wired, the fault which is present in the circuit.

OPERATION

Referring to FIG. 2, prior to use of this invention to test the polarity and wiring of a lamp holder the cage bars 44 are opened to allow access to lamp 36. Thereafter lamp 36 is unscrewed and removed from screw type socket 14. The plug (not shown) of the three-wire cord 16 is inserted into an electrical outlet (not shown).

Referring to FIG. 1, receptacle circuit tester 50 is electrically connected to adapter 60 by inserting the three prongs 52 into the appropriate three holes of receptacle 66. Thereafter, probe 68 of adapter 60 is inserted into socket 14 of lamp holder 10 by means of straight line movement thereof. While within socket 14, tip 76 of probe 68 is placed in electrical contact with contact 20 in the base of the socket 14. Band 78 of probe 68 is placed in electrical contact with the threaded portion 24 of socket 14. Spring clip 82 is placed in electrical contact with ground plate 28 of lamp holder 10. While so positioned the lamps 54 of receptacle circuit tester 50 indicate whether the lamp holder 10 is properly wired and, if not properly wired, the fault or defect in the wiring.

While this invention has been described in considerable detail, one skilled in the art to which it pertains will realize that there are many alternatives which could be practiced within the scope and spirit of the invention. Thus, the inventor does not intend that his invention be limited to any specific embodiment but intends that his invention include alternatives and equivalents as fall within the spirit of his invention and as defined by the claims.

I claim:

1. An adaptor to facilitate the testing of a lamp holder comprising:
   A. a body made of electrically non-conductive material, said body having a probe made of electrically non-conductive material with a tip made of electrically conductive material, said tip made of electrically conductive material for insertion by straight line movement into the socket of a lamp holder to contact the hot lead thereof,
   B. a band of electrically conductive material on said probe to contact the neutral lead of said lamp holder,
   C. a spring clip attached to said body to contact the ground lead of said lamp holder, and
   D. a three-hole receptacle attached to said body with one hole electrically connected to said tip, the second hole electrically connected to said band and the third hole electrically connected to said clip.
2. The adaptor of claim 1 further comprising a receptacle circuit tester having its prongs electrically connected to said three-hole receptacle.
3. The adaptor of claims 2 or 3 wherein said socket of said lamp holder is of the screw type.

* * * * *